United States Patent
Shioya et al.

(10) Patent No.: US 7,238,629 B2
(45) Date of Patent: Jul. 3, 2007

(54) DEPOSITION METHOD, METHOD OF MANUFACTURING SEMICONDUCTOR DEVICE, AND SEMICONDUCTOR DEVICE

(75) Inventors: Yoshimi Shioya, Chiba (JP); Kazuo Maeda, Chiba (JP)

(73) Assignee: Semiconductor Process Laboratory Co., Ltd. (JP)

( * ) Notice: Subject to any disclaimer, the term of this patent is extended or adjusted under 35 U.S.C. 154(b) by 149 days.

(21) Appl. No.: 10/867,178

(22) Filed: Jun. 15, 2004

(65) Prior Publication Data
US 2005/0014391 A1    Jan. 20, 2005

(30) Foreign Application Priority Data

Jun. 17, 2003  (JP)  ............................. 2003-172395
Jun. 9, 2004   (JP)  ............................. 2004-171399

(51) Int. Cl.
*H01L 21/44* (2006.01)
*H01L 21/469* (2006.01)
*H01L 21/31* (2006.01)

(52) U.S. Cl. ...................... 438/789; 438/676; 438/771; 438/772; 438/765; 438/794; 257/760; 257/762; 257/E21.274; 257/E21.492

(58) Field of Classification Search ............... 438/789, 438/676, 771–772, 765, 794; 257/760, 762
See application file for complete search history.

(56) References Cited

U.S. PATENT DOCUMENTS

2002/0113316 A1* 8/2002 Shioya et al. ................ 257/762
2002/0187262 A1  12/2002 Rocha-Alvarez et al.

FOREIGN PATENT DOCUMENTS

| EP | 1 077 480    | * | 8/1999  |
| EP | 1 077 480 A1 |   | 8/1999  |
| EP | 1 148 539 A2 |   | 4/2001  |
| EP | 1 209 728    | * | 10/2001 |
| EP | 1 209 728 A2 |   | 10/2001 |
| JP | 2000-58641   |   | 2/2000  |
| JP | 2002-252228  |   | 6/2001  |
| WO | 03/052162 A1 |   | 12/2002 |
| WO | 03/095702 A2 |   | 8/2003  |

* cited by examiner

*Primary Examiner*—Michael Lebentritt
*Assistant Examiner*—Mohsen Ahmadi
(74) *Attorney, Agent, or Firm*—Bacon & Thomas, PLLC

(57) ABSTRACT

The present invention relates to a deposition method of a low dielectric constant insulating film, which comprises the steps of generating a first deposition gas containing at least one silicon source selecting from the group consisting of silicon containing organic compound having siloxane bond and silicon containing organic compound having $CH_3$ group, and an oxidizing agent consisting of oxygen containing organic compound having alkoxyl group (OR: O is oxygen and R is $CH_3$ or $C_2H_5$), and applying electric power to the first deposition gas to generate plasma and then causing reaction to form a low dielectric constant insulating film on a substrate.

11 Claims, 8 Drawing Sheets

FIG. 2

| Identification of Formed Film | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Kind of Formed Film | Low-k | | | | | | | | Barrier | | | | | | | |
| Silicon Containing Organic Compound | O | O | O | O | O | O | O | O | O | O | O | O | O | O | O | O |
| Oxidizing Agent | O | O | O | O | O | O | O | O | O | O | O | O | O | O | O | O |
| $H_2O$ | | O | O | O | O | | | | | | O | O | O | | | |
| Diluent Gas | | | O | | | O | O | | | | O | O | | O | O | |
| CxHyFz, CxHyBz | | | | O | | | O | O | | | | | | | O | O |
| $H_2$, Heavy Hydrogen, $N_2O$, $O_2$ | | | | | | | | | O | O | | | | | | O |

Note1) "Low-k" in Column of Identification of Formed Film indicates a low dielectric constant insulating film, and "Barrier" therein indicates a Barrier insulating film.

DEPOSITION METHOD, METHOD OF MANUFACTURING SEMICONDUCTOR DEVICE, AND SEMICONDUCTOR DEVICE

BACKGROUND OF THE INVENTION

1. Field of the Invention

The present invention relates to a deposition method, a method of manufacturing a semiconductor device, and a semiconductor device, particularly to a deposition method of a low dielectric constant insulating film using a chemical vapor deposition method, a method of manufacturing a semiconductor device, and a semiconductor device, which are provided with a low dielectric constant interlayer insulating film that is made up of a barrier insulating film coating copper wire and a low dielectric constant insulating film.

2. Description of the Prior Art

In recent years, higher data transfer speed has been required with higher integration and higher density of a semiconductor integrated circuit device. For this reason, an insulating film having a low dielectric constant with a small RC delay time (hereinafter, referred to as a low dielectric constant insulating film) has been used.

Further, in the deposition method of the low dielectric constant insulating film, $N_2O$, $O_2$ or $H_2O$ gas has been conventionally used as oxidizing agent in addition to silicon containing compound.

However, in the deposition using $O_2$ gas out of $N_2O$, $O_2$ and $H_2O$ gas as the oxidizing agent, a formed film contains OH and it is difficult to reduce a relative dielectric constant (k) to 3.0 or less.

Since $H_2O$ has slow oxidizing rate, it requires a relatively large flow rate and a deposition rate decreases to the range of 200 nm/min.

Further, although oxidization is easily controlled in $N_2O$, a formed film contains nitrogen (N) and there is a possibility of causing excessive crosslinking reaction of chemically amplified resist due to the following reason.

Specifically, there is the case where the chemically amplified resist for KrF or ArF is employed to expose a line width of 0.13 μm or less when via holes and wiring grooves are formed by a dual damascene method in a low dielectric constant insulating film deposited using deposition gas containing nitrogen. In this case, there has been a problem that patterns as designed could not be formed. According to various examinations, it is presumed that this phenomenon is caused by the emission of nitrogen in the low dielectric constant insulating film and the generation of excessive crosslinking reaction of resist. The phenomenon tends to occur particularly when $N_2O$ is used as the oxidizing agent of the deposition gas of the low dielectric constant insulating film.

SUMMARY OF THE INVENTION

The object of the present invention is to provide a deposition method of a low dielectric constant insulating film, in which the formed film is prevented from containing nitrogen while deposition rate is improved or nitrogen content can be suppressed to an extent where nitrogen does not affect the crosslinking reaction of resist, a method of manufacturing a semiconductor device and a semiconductor device, which is provided with the low dielectric constant insulating film and a barrier insulating film having a lower dielectric constant.

According to the present invention, since the oxidizing agent made of oxygen-containing organic compound having alkoxyl group (OR: O is oxygen and R is $CH_3$ or $C_2H_5$) is used as an oxidizing agent, a formed film does not contain nitrogen. In this case, the organic compound having alkoxyl group (OR: O is oxygen and R is $CH_3$ or $C_2H_5$) is used instead of $O_2$ containing no nitrogen as the oxidizing agent. This is because it improves the deposition rate and allows the formed film to take in a larger amount of carbon and hydrogen so that the low dielectric constant insulating film or the barrier insulating film having a lower relative dielectric constant can be formed. Particularly, in order to obtain a lower relative dielectric constant which is, for example, 2.5 or less in the low dielectric constant insulating film and 4 or less in the barrier insulating film, it is effective to use oxygen containing organic compound in which silicon combines with three or less methoxy groups or ethoxy groups as oxygen containing organic compound having alkoxyl group.

Furthermore, doping $H_2O$ as the oxidizing agent can lead to improvement of the film quality of the formed film.

In both cases, since a large amount of C—H and O—H, which is considered to have weak bond, is contained in the formed film, the relative dielectric constant is still as high as 2.6 to 2.7 comparing to that of an SOD film (Spin On Dielectrics). Therefore, plasma treatment is performed to the formed film after deposition to discharge C—H and O—H.

In the plasma treatment, treatment gas is generated to adjust gas pressure thereof, and electric power is applied to the treatment gas to generate plasma. The plasma of the treatment gas is allowed to contact the low dielectric constant insulating film whose temperature has been increased. According to the examination, the relative dielectric constant of the formed film can be further reduced by employment of a plasma that is generated by applying electric power to the treatment gas containing at least one of He, Ar, other noble gas, $H_2$ and heavy hydrogen.

Consequently, it is possible to prevent the low dielectric constant insulating film from containing nitrogen or to suppress nitrogen content to an extent where nitrogen does not affect the crosslinking reaction of resist, while it is possible to maintain characteristic of the low relative dielectric constant from 2.4 to 2.5 and of superior moisture resistance.

Furthermore, the silicon containing organic compound having a siloxane bond is used as the constituent gas of the deposition gas. This is because the compound already contains Si—O—Si, and thus Si—O bond is directly taken in the formed film whereby excessive reaction of oxygen can be suppressed. Further, it is because it can stabilize the formed film.

In addition, the silicon containing organic compound having $CH_3$ group is employed as the constituent gas of the deposition gas. This is because when the formed film contains a large amount of $CH_3$ group, Si is terminated with $CH_3$ group, and thus pores can be formed to reduce the dielectric constant.

Further, film formation is performed by incorporating $C_xH_yF_z$ or $C_xH_yB_z$ (x and y are 0 (except x=y=0) or positive integer, z is positive integer) in the deposition gas of the low dielectric constant insulating film. This can lead to securing an etching resistance of the low dielectric constant insulating film against the etchant of the barrier insulating film in the case of selectively etching the barrier insulating film in a laminated structure of the low dielectric constant insulating film and the barrier insulating film. Particularly, the employment of $C_xH_yF_z$ or $C_xH_yB_z$ can lead to securing the etching resistance and allowing it to contain F or B to achieve lower dielectric constant.

In the barrier insulating film used together with the low dielectric constant insulating film, a second deposition gas is used. The second deposition gas contains either the silicon containing organic compound having siloxane bond or the silicon containing organic compound having $CH_3$ group and the oxygen containing organic compound having alkoxyl group (OR: O is oxygen and R is $CH_3$ or $C_2H_5$) as the oxidizing agent in the same manner as the case of the low dielectric constant insulating film, and is generated by further adding at least one of $H_2$, $N_2O$ and $O_2$ thereto In other words, by further incorporating at least one of $H_2$, $N_2O$ and $O_2$ to a first deposition gas of the low dielectric constant insulating film, it is possible to form a film of better film quality, whose function to block Cu diffusion is improved although the relative dielectric constant is a little higher than that of the low dielectric constant insulating film. In addition, it is possible to prevent the barrier insulating film from containing nitrogen.

BRIEF DESCRIPTION OF THE DRAWINGS

FIG. 2 is a table showing the particularly effective combinations of gases with regard to the deposition gas of a low dielectric constant insulating film and a Cu barrier insulating film, which are used in the manufacturing method of a semiconductor device, which is the first embodiment of the present invention.

DESCRIPTION OF THE PREFERRED EMBODIMENTS

Embodiments of the present invention will be explained with reference to the drawings hereinafter.

First Embodiment (Explanation of the plasma CVD/Treatment Apparatus used in the Deposition Method that is the Embodiment of the Present Invention)

Figure 1:
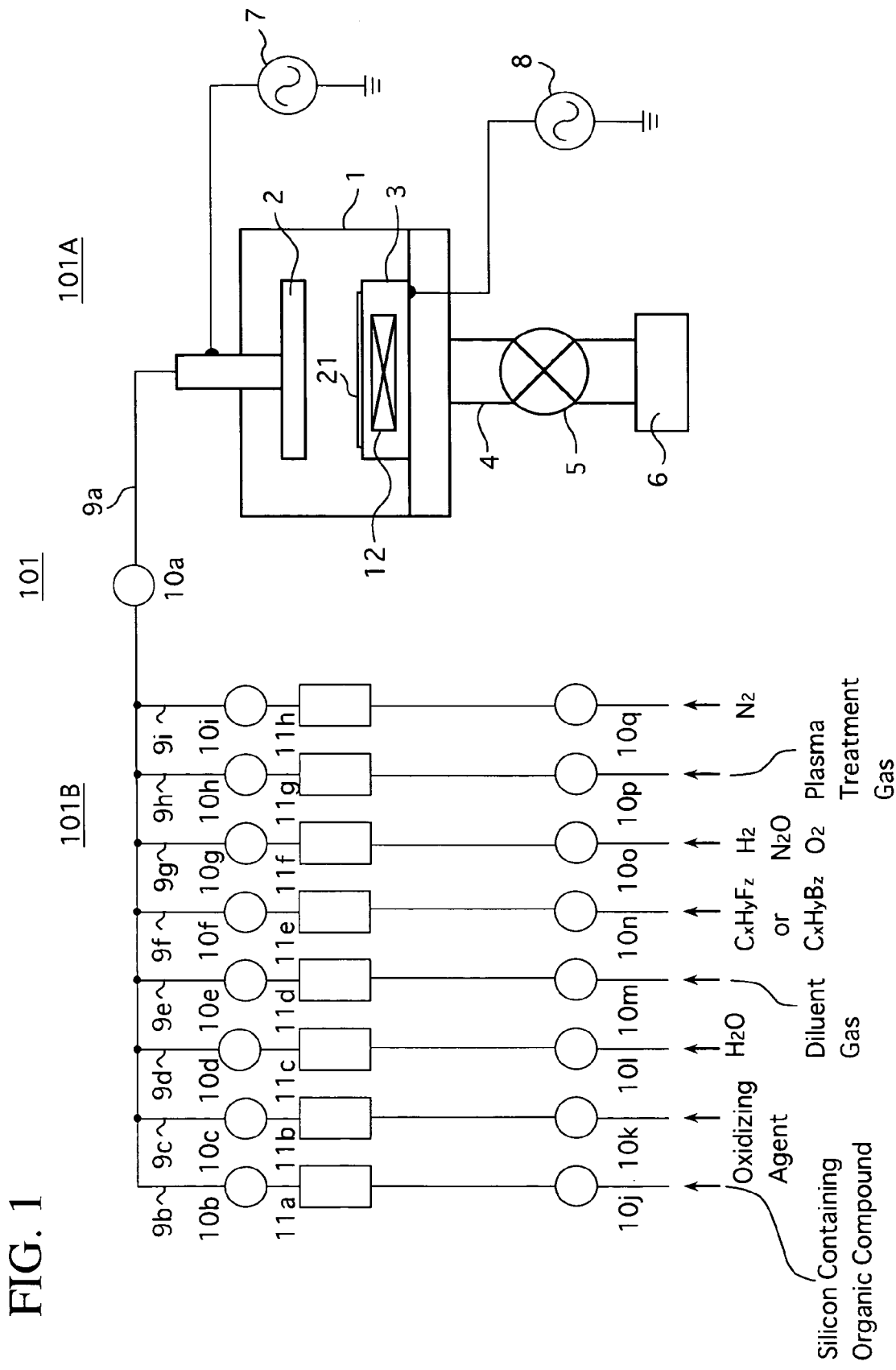
FIG. 1 is a side view showing the constitution of a plasma CVD apparatus used in a manufacturing method of a semiconductor device, which is a first embodiment of the present invention.

FIG. 1 is the side view showing the constitution of a parallel plate type plasma enhanced CVD/treatment apparatus 101 used in the manufacturing method of a semiconductor device according to the embodiment of the present invention.

The parallel plate type plasma enhanced CVD/treatment apparatus 101 is made up of a deposition/treatment section 101A, which is a place of forming the barrier insulating film and the low dielectric constant insulating film on a substrate 21 by plasma gas and also a place of performing plasma treatment to the formed film, and a deposition gas/treatment gas supply section 101B having supply sources of plurality of gases that constitute the deposition gas and the treatment gas.

The deposition/treatment section 101A comprises a chamber 1, whose pressure can be reduced and which is connected to an exhaust unit 6 via an exhaust pipe 4. An opening/closing valve 5 that controls communication/non-communication between the chamber 1 and the exhaust unit 6 is provided halfway the exhaust pipe 4. The chamber 1 is provided with pressure measurement means such as a vacuum meter (not shown) for monitoring the pressure inside the chamber 1.

A pair of upper electrode 2 and a lower electrode 3 opposing to each other are provided in the chamber 1. A first high-frequency power supply source (RF power source) 7, which supplies high-frequency power having the frequency of 13.56 MHz to the upper electrode 2, is connected to the upper electrode 2. And a second high-frequency power supply source 8, which supplies low-frequency power having the frequency of 380 kHz to the lower electrode 3, is connected to the lower electrode 3. At least the first high-frequency power supply source 7 of the high-frequency power supply sources 7, 8 supplies high-frequency power (PHF) to the upper electrode 2 or the second high-frequency power supply source 8 supplies low-frequency power (PLF) to the lower electrode 3, and thus the deposition gas or the like is transformed into plasma. The upper electrode 2, the lower electrode 3, and the power sources 7, 8 constitute plasma generation means that transforms the deposition gas or the like into plasma.

Note that low-frequency power of not only the frequency of 380 kHz but also the frequency of 100 kHz or higher and lower than 1 MHz can be applied to the lower electrode 3, and the high-frequency power of not only the frequency of 13.56 MHz but also the frequency of 1 MHz or higher may be applied to the upper electrode 2 opposing to the lower electrode 3. Further, in FIG. 1, the first high-frequency power supply source is connected to the upper electrode 2, and the second high-frequency power supply source 8 is connected to the lower electrode 3. But the object of the present invention can be achieved when the first high-frequency power supply source is connected not necessarily to the upper electrode 2 but connected to either the upper electrode 2 or the lower electrode 3 and the second high-frequency power supply source is connected not necessarily to the lower electrode 3 but connected to another electrode.

The upper electrode 2 serves as a diffuser of the deposition gas or the like. A plurality of through holes are formed in the upper electrode 2, and openings of the through holes at the opposing surface to the lower electrode 3 are release ports (introduction ports) of the deposition gas or the like. The release ports of the deposition gas or the like is connected to the deposition gas/treatment gas supply section 101B via piping 9a. Alternatively, a heater (not shown) is provided for the upper electrode 2 depending on circumstances. The heater is used to heat the upper electrode 2 to the temperature of about 100° C. during deposition to prevent particles made of reactive product of the deposition gas or the like from adhering to the upper electrode 2.

The lower electrode 3 serves as a holding stage for the substrate 21, and is provided with a heater 12 heating the substrate 21 on the holding stage.

The deposition gas/treatment gas supply section 101B is provided with a supply source of the silicon containing organic compound having siloxane bond or the silicon containing organic compound having CH$_3$ bond, a supply source of H$_2$O, a supply source of He, Ar or H$_2$ as diluent gas, a supply source of C$_x$H$_y$F$_z$ or C$_x$H$_y$B$_z$, and a supply source of H$_2$, N$_2$O or O$_2$ used when depositing the barrier insulating film, as the supply sources of the deposition gas. Further, it is provided with a supply source of He, Ar, other noble gas, H$_2$ or heavy hydrogen as the supply sources of plasma treatment gas, and a supply source of nitrogen (N$_2$) as purge gas.

These gases are accordingly supplied into the chamber 1 through branch piping 9b to 9i and the piping 9a to which all the branch piping 9b to 9i are connected. The branch piping 9b to 9i are equipped halfway with flow rate adjusting means 11a to 11h and opening/closing means 10b to 10q for controlling communication/non-communication of the branch piping 9b to 9i, the piping 9a is equipped halfway with opening/closing means 10a for communicating/non-communicating the piping 9a.

According to the above-described deposition/treatment apparatus 101, it comprises the supply source of the silicon containing organic compound having siloxane bond or the silicon containing organic compound having CH$_3$ bond, a supply source of the oxygen containing organic compound having alkoxyl group as the oxidizing agent, the supply source of H$_2$O, the supply source of He, Ar or H$_2$ as diluent gas, the supply source of C$_x$H$_y$F$_z$ or C$_x$H$_y$B$_z$, and the supply source of H$_2$, N$_2$O or O$_2$ used when depositing the barrier insulating film, as the supply sources of the deposition gas. Further, it comprises the supply source of He, Ar, other noble gas, H$_2$ or heavy hydrogen as the supply sources of plasma treatment gas, and the supply source of nitrogen (N$_2$) as purge gas. Moreover, it comprises plasma generation means 2, 3, 7, 8 that transform the deposition gas and the treatment gas into plasma.

With this constitution, it is possible to perform continuously in a same chamber deposition of the low dielectric constant insulating film (low-k film) made up of a silicon oxide film having low dielectric constant, plasma treatment after depositing the low dielectric constant insulating film (described below) and deposition of the Cu barrier insulating film made up of a silicon oxide film or a silicon oxy-nitride film having a barrier function to prevent Cu diffusion.

(Explanation of the Manufacturing Method of a Semiconductor Device, which is the Embodiment of the Present Invention)

Next, description will be made for the deposition method of the low dielectric constant insulating film and the Cu barrier insulating film used in the manufacturing method of a semiconductor device, which is the embodiment of the present invention.

In the low dielectric constant insulating film and the Cu barrier insulating film, the entire process of film formation is different from each other, in addition to deposition conditions. Specifically, deposition process and treatment process (plasma treatment) to the formed film after deposition are required to create the low dielectric constant insulating film (low-k film), which has superior moisture resistance and low dielectric constant, contains no nitrogen, or contains trace of nitrogen. Further, only the deposition process is basically required to create the Cu barrier insulating film, which has superior diffusion preventing function of copper, contains no nitrogen, or contains trace of nitrogen, and the treatment process to the formed film after deposition is not necessary.

Firstly, the particularly effective combinations of gases of the deposition conditions, which constitute the deposition gas of the low dielectric constant insulating film and the Cu barrier insulating film, will be described with reference to FIG. 2.

FIG. 2 is the table showing the combinations of gases that constitute the deposition gas for forming the low dielectric constant insulating film (low-k film) and the Cu barrier insulating film. The particularly effective constitution of the deposition material will be cited according to the indication of the formed film in FIG. 2 as follows.

(i) Constituent gas of the Deposition Gas to Form a Low Dielectric Constant Insulating Film (1) Silicon containing organic compound/oxidizing agent Herein, there are cases where silicon containing organic compound is made up of two or more kinds of siloxane, and in such a case, one or more of straight chain siloxane and one or more of cyclic siloxane are contained. The same applies to the followings.

(2) Silicon containing organic compound/Oxidizing agent/H$_2$O (3) Silicon containing organic compound/Oxidizing agent/H$_2$O/Diluent gas (4) Silicon containing organic compound/Oxidizing agent/H$_2$O/Diluent gas/C$_x$H$_y$F$_z$ or C$_x$H$_y$B$_z$ (5) Silicon containing organic compound/Oxidizing Agent/H$_2$O/C$_x$H$_y$F$_z$ or C$_x$H$_y$B$_z$ (6) Silicon containing organic compound/Oxidizing agent/Diluent gas (7) Silicon containing organic compound/Oxidizing agent/Diluent gas/C$_x$H$_y$F$_z$ or C$_x$H$_y$B$_z$ (8) Silicon containing organic compound/Oxidizing agent/C$_x$H$_y$F$_z$ or C$_x$H$_y$B$_z$ (ii) Constituent Gas of the Deposition Gas to Form a Cu Barrier Insulating Film (9) Silicon containing organic compound/Oxidizing agent/H$_2$, N$_2$O, O$_2$

(10) Silicon containing organic compound/Oxidizing agent/H$_2$O/H$_2$, N$_2$O, O$_2$

(11) Silicon containing organic compound/Oxidizing agent/H$_2$O/Diluent gas/H$_2$, N$_2$O, O$_2$

(12) Silicon containing organic compound/Oxidizing agent/H$_2$O/Diluent gas/C$_x$H$_y$F$_z$ or C$_x$H$_y$B$_z$/H$_2$, N$_2$O, O$_2$

(13) Silicon containing organic compound/Oxidizing agent/H$_2$O/C$_x$H$_y$F$_z$ or C$_x$H$_y$B$_z$/H$_2$, N$_2$O, O$_2$

(14) Silicon containing organic compound/Oxidizing agent/Diluent gas/H$_2$, N$_2$O, O$_2$

(15) Silicon containing organic compound/Oxidizing agent/Diluent gas/C$_x$H$_y$F$_z$ or C$_x$H$_y$B$_z$/H$_2$, N$_2$O, O$_2$

(16) Silicon containing organic compound/Oxidizing agent/C$_x$H$_y$F$_z$ or C$_x$H$_y$B$_z$/H$_2$, N$_2$O, O$_2$ Next, description will be made for the above-described silicon containing organic compound, oxidizing agent, diluent gas, and C$_x$H$_y$F$_z$ or C$_x$H$_y$B$_z$.

The followings can be used as typical examples.

(i) Silicon Containing Organic Compound (A) Silicon Containing Organic Compound having Siloxane Bond (a) Organic Compound having Straight Chain Si—O—Si Bond Hexamethyldisiloxane (HMDSO:(CH$_3$)$_3$Si—O—Si(CH$_3$)$_3$)

Octamethyltrisiloxane (OMTS)

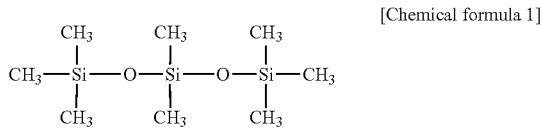

[Chemical formula 1]

(b) Organic Compound having Cyclic Si—O—Si Bond
Octamethylcyclotetrasiloxane (OMCTS)

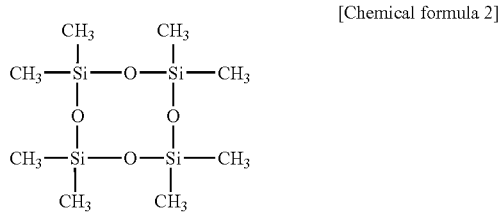

[Chemical formula 2]

Tetramethylcyclotetrasiloxane (TMCTS)

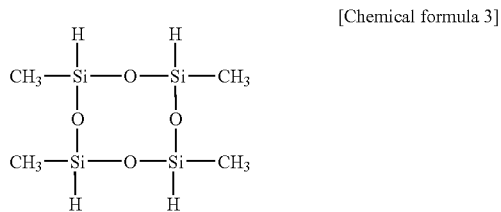

[Chemical formula 3]

(B) Silicon Containing Organic Compound having $CH_3$ Bond

Monomethylsilane ($SiH_3(CH_3)$)
Dimethylsilane ($SiH_2(CH_3)_2$)
Trimethylsilane ($SiH(CH_3)_3$)
Tetramethylsilane ($Si(CH_3)_4$)

(ii) Oxidizing Agent (A) Oxygen Containing Organic Compound having Methoxy Group Methoxysilane ($SiH_3(OCH_3)$), Dimethoxysilane ($SiH_2(OCH_3)_2$), Trimethoxysilane (TMS:$SiH(OCH_3)_3$), Tetramethoxysilane ($Si(OCH_3)_4$), Trimethylmethoxysilane ($Si(CH_3)_3(OCH_3)$), Dimethyldimethoxysilane ($Si(CH_3)_2(OCH_3)_2$), Monomethyltrimethoxysilane ($Si(CH_3)(OCH_3)_3$)

(B) Oxygen Containing Organic Compound having Ethoxy Group

Ethoxysilane ($SiH_3(OC_2H_5)$), Diethoxysilane ($SiH_2(OC_2H_5)_2$) Triethoxysilane ($SiH(OC_2H_5)_3$), Tetraethoxysilane (TEOS:$Si(OC_2H_5)_4$), Triethylethoxysilane ($Si(C_2H_5)_3(OC_2H_5)$), Diethyldiethoxysilane ($Si(C_2H_5)_2(OC_2H_5)_2$), Monoethyltriethoxysilane ($Si(C_2H_5)(OC_2H_5)_3$)

(iii) Diluent Gas

He, Ar, $H_2$ (iv) $C_xH_yF_z$ or $C_xH_yB_z$ (a) $C_xH_yF_z$ $C_3F_8$
$C_4F_8$
$CHF_3$ (b) $C_xH_yB_z$ $B_2H_6$

Next, the deposition conditions other than the above-described ones and the entire process of film formation will be explained, and the reasons or effects of adopting the deposition conditions including the above and the entire process of film formation will be described.

In formation of the low dielectric constant insulating film, the oxidizing agent made up of oxygen containing organic compound having alkoxyl group (OR: O is oxygen and R is $CH_3$ or $C_2H_5$) is used as the oxidizing agent in order to prevent the formed film from containing nitrogen. In this case, the oxygen containing organic compound having alkoxyl group is used as the oxidizing agent instead of $O_2$ containing no nitrogen. The reason is that it can improve the deposition rate and the formed film can take in a larger amount of carbon and hydrogen to form the low dielectric constant insulating film or the barrier insulating film having a lower relative dielectric constant. Particularly, since the lower relative dielectric constant which is 2.5 or less in the low dielectric constant insulating film and 4 or less in the barrier insulating film are obtained, for example, it is effective to use oxygen containing organic compound having silicon which combines with three or less methoxy groups or ethoxy groups as oxygen containing organic compound having alkoxyl group.

Furthermore, by doping $H_2O$ as the oxidizing agent, the film quality of the formed film can be improved.

In both cases, since a large amount of C—H or the like, which is considered to have weak bond, is contained in the formed film, the relative dielectric constant is still as higher as 2.6 to 2.7 comparing to that of the SOD film (Spin On Dielectrics). Therefore, plasma treatment is performed to the formed film after deposition to discharge C—H or the like, and the relative dielectric constant is further reduced.

In the plasma treatment, gas containing at least one of other noble gas, for example, He or Ar, $H_2$ and heavy hydrogen is prepared, and then gas pressure is adjusted to 1 Torr or less, 0.5 Torr or less preferably, and thus the treatment gas is generated. Then, electric power is applied to the treatment gas to transform it into plasma. The temperature of the low dielectric constant insulating film is increased to 375° C. or higher, preferably in the range of 400° C. and 450° C., and then the plasma of the treatment gas is allowed to contact the film. According to the examination, by employing plasma that is generated by applying electric power, which is electric power having the frequency of 1 MHz or higher, to the treatment gas which contains at least one of He, Ar, $H_2$ and heavy hydrogen and whose gas pressure is adjusted to 1 Torr or less, the relative dielectric constant of the formed film can be further reduced. In this case, the reason why the temperature of the low dielectric constant insulating film is increased to 375° C. or higher is to fully remove moisture and the like in the formed film, which are not completely removed by plasma.

Consequently, the low dielectric constant insulating film can be prevented from containing nitrogen or nitrogen content can be suppressed to an extent where nitrogen does not affect the crosslinking reaction of resist while it has the low relative dielectric constant from 2.4 to 2.5 and maintains characteristic of superior moisture resistance.

Furthermore, the silicon containing organic compound having siloxane bond is used as the constituent gas of the deposition gas. It is because the compound already contains Si—O—Si, and thus Si—O bond is directly taken in the formed film, whereby excessive reaction of oxygen can be suppressed, and because it can stabilize the formed film.

Further, $C_xH_yF_z$ or $C_xH_yB_z$ (x and y are 0 (except x=y=0) or positive integer, z is positive integer) may be incorporated in the deposition gas of the low dielectric constant insulating film. Thus, it is possible to secure the etching resistance of the low dielectric constant insulating film against the etchant of the barrier insulating film in the case of selectively etching the Cu barrier insulating film in the structure where the low dielectric constant insulating film and the Cu barrier insulating film are laminated. Particularly, an employment of $C_xH_yF_z$ or $C_xH_yB_z$ results in that it is possible to secure the etching resistance and that it is possible to allow the formed film to contain F or B and thus achieve a lower dielectric constant.

Furthermore, in the Cu barrier insulating film used together with the low dielectric constant insulating film, at least one of $H_2$, $N_2O$ and $O_2$ is added to the first deposition gas of the low dielectric constant insulating film. In this case, the gas pressure is set to as low as less than 1.0 Torr when frequency for generating plasma of electric power to be applied is less than 1 MHz, and it is set to as high as 1.0 Torr or higher when the frequency for generating plasma is 1 MHz or higher and bias electric power having the frequency less than 1 MHz is applied. In addition, the substrate temperature during deposition is set to 200° C. to 400° C. With the above-described deposition conditions, it is possible to form a film of better film quality, which is improved in a function to block Cu diffusion although it is a little higher in the relative dielectric constant. In addition, it is possible to prevent the Cu barrier insulating film from containing nitrogen.

Still further, $C_xH_yF_z$ or $C_xH_yB_z$ (x and y are 0 (except x=y=0) or positive integer, z is positive integer) may be incorporated in the deposition gas of the Cu barrier insulating film. Thus, it is possible to secure the etching resistance of the Cu barrier insulating film against the etchant of the low dielectric constant insulating film in the case of selectively etching the low dielectric constant insulating film in the structure where the Cu barrier insulating film and the low dielectric constant insulating film are laminated.

In the case of forming the Cu barrier insulating film on the low dielectric constant insulating film subsequently after it is formed, it is preferable to perform the deposition of the Cu barrier insulating film subsequently without exposing the low dielectric constant insulating film to air. This is to prevent the low dielectric constant insulating film from absorbing moisture in air to increase the relative dielectric constant.

Next, examples of the deposition conditions will be described as follows.

(1) FIRST EXAMPLE

The insulating film of the first example is an example of the low dielectric constant insulating film. Trimethoxysilane is used as the oxidizing agent.
(Deposition Conditions I)
(i) Deposition Gas Conditions
HMDSO gas flow rate: 100 sccm
Trimethoxysilane: 50 sccm
Gas pressure: 1.7 Torr
(ii) Conditions for Generating Plasma
High-frequency power (13.56 MHz) PHF: 300W
Low-frequency power (380 KHz) PLF: 0W
(A size of the electrode is 345 mm φ, which is the same hereinafter.)
(iii) Substrate Heating Temperature: 375° C.
(iv) Deposited Silicon Oxide Film
Film thickness: 700 nm
Relative dielectric constant: 2.5

(2) SECOND EXAMPLE

The insulating film of the second example is another example of the low dielectric constant insulating film. $H_2O$ is added to the deposition conditions I.
(Deposition Conditions II)
(i) Deposition Gas Conditions
HMDSO gas flow rate: 100 sccm
Trimethoxysilane: 50 sccm
$H_2O$ gas flow rate: 400 sccm
Gas pressure: 1.7 Torr
(ii) Conditions for Generating Plasma
High-frequency power (13.56 MHz) PHF: 300W
Low-frequency power (380 KHz) PLF: 0W
(iii) Substrate Heating Temperature: 375° C.
(iv) Deposited Silicon Oxide Film
Film thickness: 700 nm
Relative dielectric constant: 2.5

(3) THIRD EXAMPLE

The insulating film of the third example is an example of the barrier insulating film. At least any one of $H_2$, $N_2O$ and $O_2$ is added to the deposition conditions I.
(Deposition Conditions III)
(i) Deposition Gas Conditions
HMDSO gas flow rate: 100 sccm
Trimethoxysilane: 50 sccm
$N_2O$ gas flow rate: 400 sccm
$CHF_3$ flow rate: Optimum quantity
Gas pressure: 1.0 Torr
(ii) Conditions for Generating Plasma
High-frequency power (13.56 MHz) PHF: 300W
Low-frequency power (380 KHz) PLF: 0W
(iii) Substrate Heating Temperature: 375° C.
(iv) Deposited Silicon Oxide Film
Film thickness: 100 nm
Relative dielectric constant: 4.0

(4) FOURTH EXAMPLE

The insulating film of the fourth example is an example of the low dielectric constant insulating film. OMCTS is employed as a silicon containing compound gas, and monomethyltrimetoxysilane (MTMS) is employed as an oxydizing agent. Further, $H_2O$ is added.
(Deposition Conditions IV)
(i) Deposition Gas Conditions
OMCTS gas flow rate: 100 sccm
MTMS: 50 sccm
$H_2O$ gas flow rate: 400 sccm
He flow rate: 100 sccm
Gas pressure (parameter): 1.3, 1.4, 1.5, 1.6, 1.7, 1.8 Torr
(ii) Conditions for Generating Plasma
High-frequency power (13.56 MHz) PHF: 562W
Low-frequency power (380 KHz) PLF: 0W
(iii) Substrate Heating Temperature: 350° C.
(iv) Deposited Silicon Oxide Film
Film thickness: 700 nm
Relative dielectric constant: approximately 2.6

Next, regarding the low dielectric constant insulating film formed in the fourth example of the first to the fourth examples, an explanation is performed for examination results of the deposition rate, dielectric constant and refractive index, leakage current and insulative breakdown electric field.

(A) Deposition Rate

Figure 4:
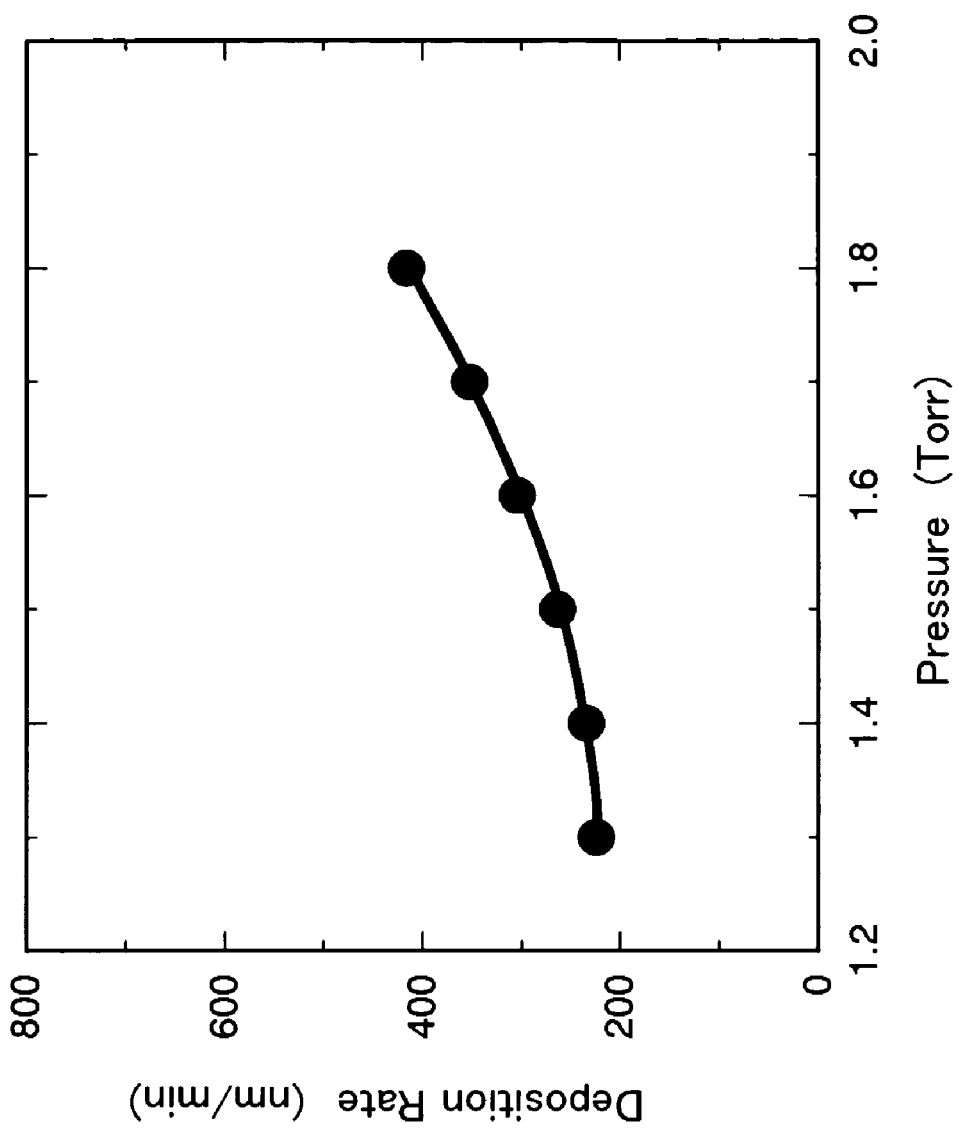
FIG. 4 is a graph showing the examination result about a pressure dependence of a deposition rate of the low dielectric constant insulating film formed by a manufacturing method of a first embodiment.

FIG. 4 is a graph showing the examination result about a pressure dependence of the deposition rate. The axis of ordinates shows the deposition rate (nm/min) indicated by a linear scale, and the axis of abscissas shows the pressure (Torr) indicated by a linear scale.

As shown in FIG. 4, the deposition rate increased approximately in proportion to the gas pressure. It was about 220 nm/min at the gas pressure of 1.3 Torr, and about 420 nm/min at 1.8 Torr. It was a level capable of applying to fabrication of a semiconductor device.

Specifically, the addition of $H_2O$ can result in facilitating a control of the deposition. Further, although an employment of only OMCTS+MTMS leads to a violent reaction and inclination of a cloudiness of the formed film, the cloudiness thereof can be prevented by the addition of $H_2O$.

(B) Dielectric Constant and Refractive Index

Figure 5:
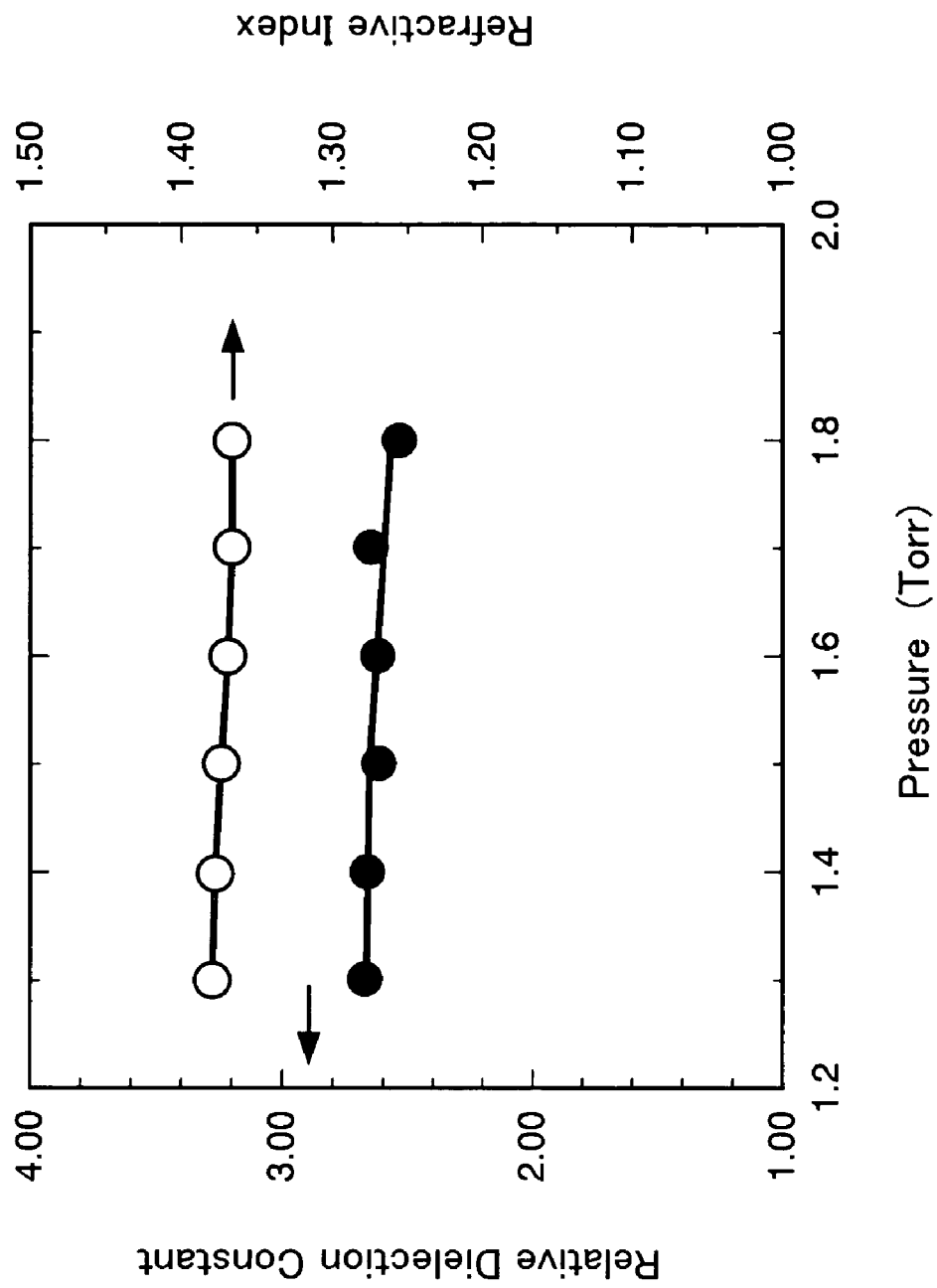
FIG. 5 is a graph showing the examination result about a pressure dependence of a relative dielectric constant and a refractive index of the low dielectric constant insulating film formed by a manufacturing method of a first embodiment.

FIG. 5 is a graph showing the examination result about a pressure dependence of the dielectric constant and refractive index. The axis of ordinates on the left side shows the dielectric constant indicated by a linear scale, the axis of ordinates on the right side shows the refractive index indicated by a linear scale, and the axis of abscissas shows the pressure (Torr) indicated by a linear scale.

As shown in FIG. 5, the dielectric constant and refractive index changed little with a change of the pressure, respectively. The dielectric constant was around 2.6. Further, the refractive index was a little less than 1.4.

(C) Leakage Current and Insulative Breakdown Electric Field

An insulating film for examination was formed on a silicon substrate. After the film formation, a probe of mercury is contacted onto the insulating film for examination, followed by applying measuring voltage between the silicon substrate and the probe of mercury, and then measuring the leakage current and the insulative breakdown electric field.

Figure 6:
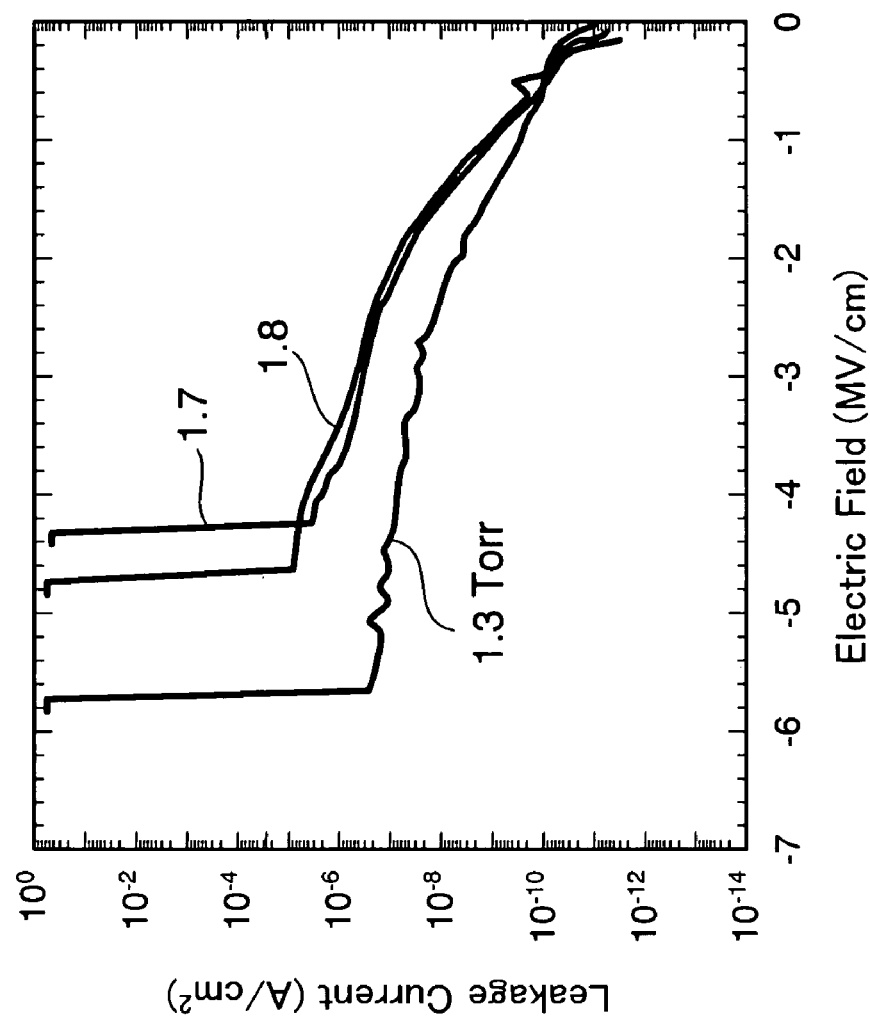
FIG. 6 is a graph showing the examination result about a leakage current and an insulative breakdown electric field of the low dielectric constant insulating film formed by a manufacturing method of a first embodiment.

FIG. 6 is a graph showing the examination result about dependency of the leakage current on an electric field. The axis of ordinates shows the leakage current density ($A/cm^2$) indicated by a logarithmic scale, and the axis of abscissas shows the electric field (MV/cm) indicated by a linear scale. A steep increase of the leakage current density indicates an occurrence of an insulative breakdown, at which the corresponding electric field is the insulative breakdown electric field (MV/cm). A negative sign in front of the number in the axis of abscissas indicates a direction for application of voltage. Further, the number accompanying each characteristic curve indicates the gas pressure (Torr).

As shown in FIG. 6, the leakage current density of Further, both of the leakage current and insulative breakdown electric field were within an allowable range for application to the semiconductor device.

Second Embodiment

Next, the semiconductor device and its manufacturing method according to a second embodiment of the present invention will be explained with reference to FIGS. 3A to 3G.

Figure 3A:
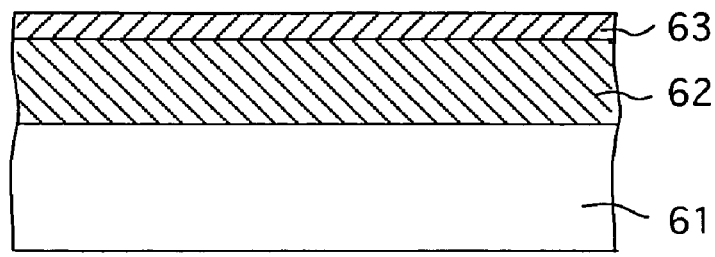
FIGS. 3A to 3G are sectional views showing the semiconductor device and a manufacturing method of a second and a third embodiments.
Figure 3B:
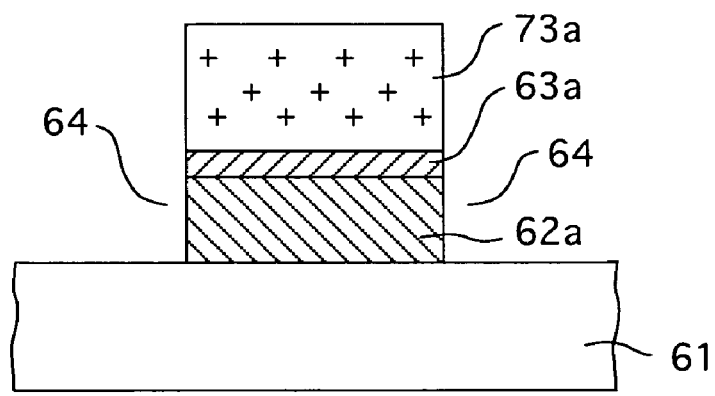
Figure 3C:
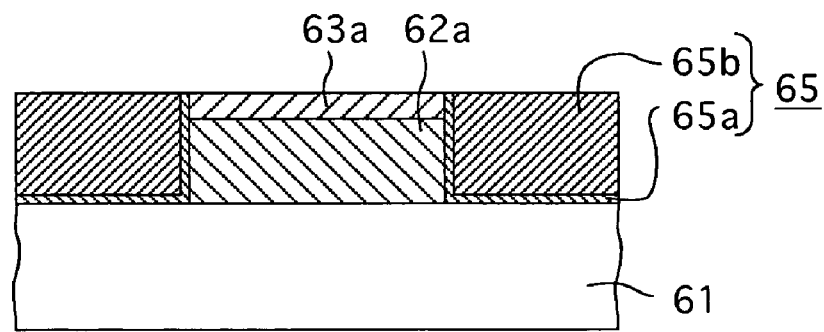
Figure 3D:
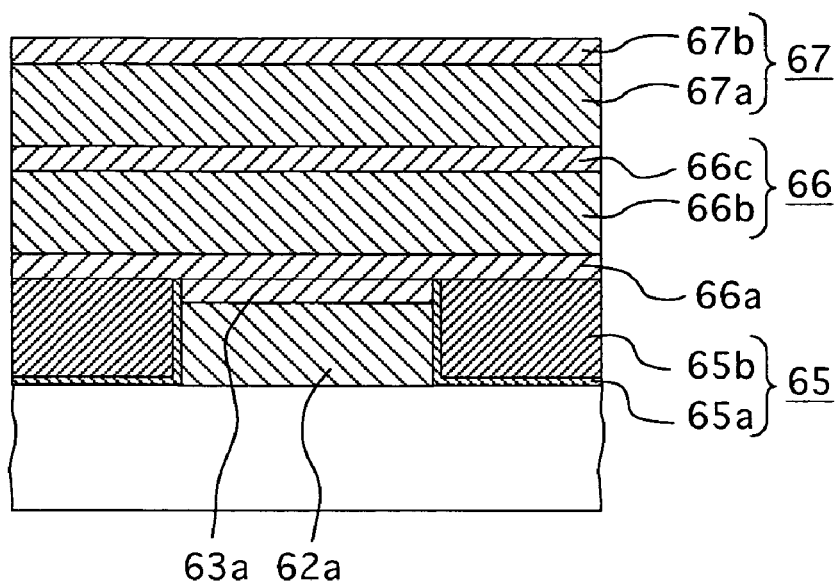
Figure 3E:
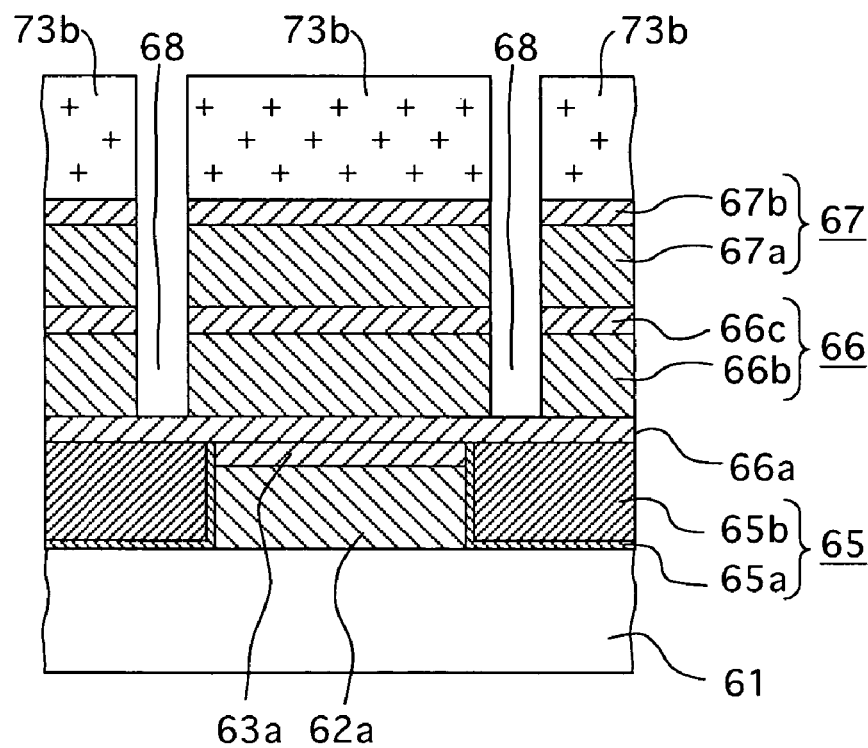
Figure 3F:
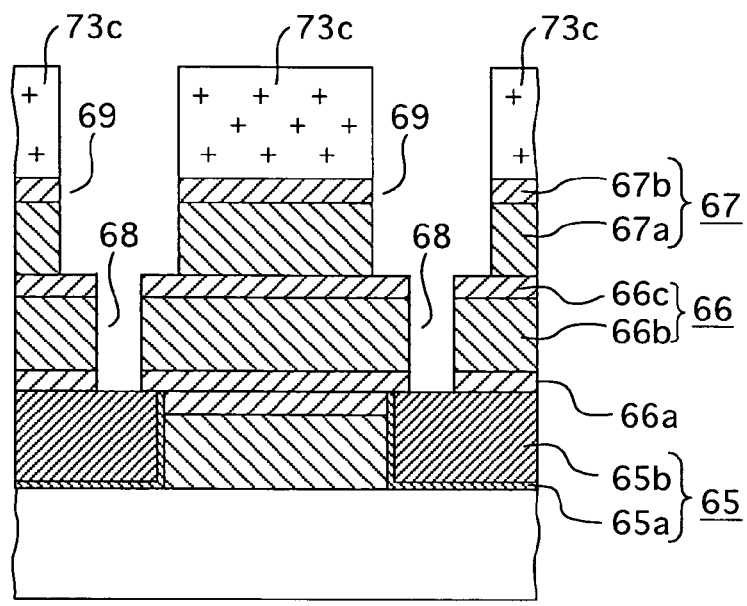
Figure 3G:
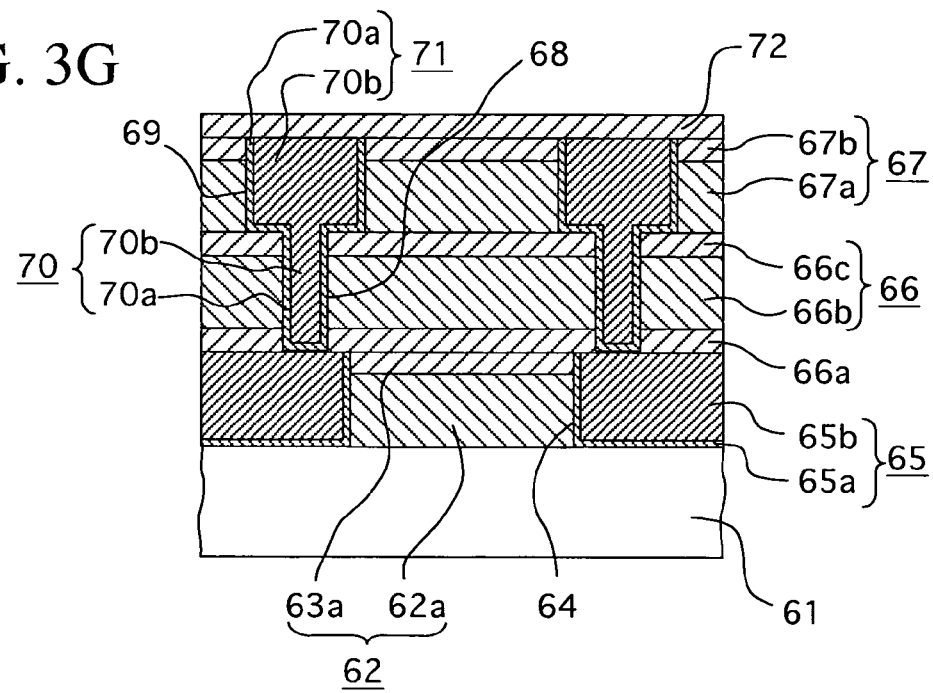

FIG. 3G is a sectional view showing the semiconductor device according to the second embodiment of the present invention. As shown in the drawing, the semiconductor device has a lower wiring buried insulating layer 62 formed on a substrate 61. The lower wiring buried insulating layer 62 has a laminated structure of a primary insulating film (low dielectric constant insulating film) 62a having low dielectric constant, which is made up of an $SiO_2$ film of the film thickness of about 500 nm, and a first upper passivation layer (Cu barrier insulating film) 63a made up of an $SiO_2$ film of the film thickness of about 50 nm. A lower wiring 65, which consists of a TaN film 65a as a copper diffusion block film and a copper film 65b, is buried in lower wiring grooves 64 formed through the lower wiring buried insulating layer 62. The substrate 61 may be a semiconductor substrate, another conductive layer, or an insulative substrate.

On them are formed a wiring interlayer insulating film 66 with via holes 68 formed therein and an upper wiring buried insulating film 67 with upper wiring grooves 69 formed therein.

The wiring interlayer insulating film 66 consists of a second lower passivation layer (Cu barrier insulating film) 66a made up of the $SiO_2$ film of the film thickness of about 50 nm, a primary insulating film (low dielectric constant insulating film) 66b having low dielectric constant, which is made up of the $SiO_2$ film of the film thickness of about 500 nm, and a second upper passivation layer (Cu barrier insulating film) 66c made up of the $SiO_2$ film of the film thickness of about 50 nm.

The upper wiring buried insulating film 67 consists of a primary insulating film (low dielectric constant insulating film) 67a having low dielectric constant, which is made up of the $SiO_2$ film of the film thickness of about 500 nm, and a third upper passivation layer (Cu barrier insulating film) 67b made up of the $SiO_2$ film of the film thickness of about 50 nm.

The upper wiring grooves 69 have an opening area larger than that of the via holes 68 and are formed so as to connect with the via holes 68. A connection conductor 70, which consists of a TaN film 70a as the copper diffusion block film and a copper film 70b, and an upper wiring 71, which consists of the TaN film 70a as the copper diffusion block film and the copper film 70b as well, are integrally buried in the via holes 68 and the upper wiring grooves 69 by a well known dual damascene method. Then, the uppermost entire surface is coated by an uppermost passivation layer (Cu barrier insulating film) 72 made up of the $SiO_2$ film according to the present invention.

All of the above-described low dielectric constant insulating films and the Cu barrier insulating films are the insulating films according to the present invention.

Next, the manufacturing method of a semiconductor device according to the second embodiment of the present invention will be explained with reference to FIGS. 3A to 3G. The deposition apparatus of FIG. 1 shall be used.

Firstly, as shown in FIG. 3A, the substrate 61 is carried into the chamber 1 of the deposition apparatus, and the $SiO_2$ film 62 having low dielectric constant of the film thickness of about 500 nm is formed on the substrate 61. The $SiO_2$ film 62 is intended to be the primary insulating film of the lower wiring buried insulating film. The deposition gas conditions shall be the silicon containing organic compound having siloxane bond, which is HMDSO gas flow rate of 100 sccm and trimethoxysilane flow rate of 50 sccm, and its gas pressure shall be 1.7 Torr. In the conditions to transform the deposition gas into plasma, the low-frequency power of 380 KHz (PLF) is not applied but 300W of the high-frequency power of 13.56 MHz (PHF) is applied. Further, the substrate temperature shall be set to 375° C. These deposition conditions are equivalent to the deposition conditions I in the first example of the first embodiment except for the film thickness. Furthermore, plasma treatment to the formed film of the third example is performed in the same chamber 1 after the deposition.

Subsequently, the film is not exposed to air and an $SiO_2$ film (Cu barrier insulating film) 63 of the film thickness of about 50 nm is formed in the same chamber 1 by a plasma CVD method. The deposition conditions are equivalent to the deposition conditions III in the third example of the first embodiment except for the film thickness. In the deposited $SiO_2$ film 63, the relative dielectric constant measured in the frequency 1 MHz was about 4.0 and leakage current was $10^{-4}$ A/cm² at the field intensity of 4MV/cm.

Then, the substrate 61 is brought out of the chamber 1, and a resist film made of the chemically amplified resist or the like is formed on the $SiO_2$ film 63. Then, opening portions of the resist film are formed by a photolithography method on regions where the wiring grooves are to be formed, and a mask 73a is formed as shown in FIG. 3B. At this point, since the $SiO_2$ film 63 does not contain nitrogen, excessive crosslinking reaction by nitrogen is suppressed and thus the crosslinking reaction of the resist film 73a occurs only in a region defined by an exposure range. Thus the mask having good dimensional precision can be formed. Subsequently, the $SiO_2$ films (63 and 62) are etched based on the mask 73a to form the wiring grooves 64 as shown in FIG. 3B. The $SiO_2$ film 63a is intended to be the passivation layer.

Next, as shown in FIG. 3C, the TaN film 65a as the copper diffusion block film is formed inside the wiring grooves 64. Subsequently, after a copper seed layer (not shown) is formed, the copper film 65b is buried to form the lower wiring 65 that consists of the TaN film, Ta film 65a and the copper film 65b.

Then, pre-treatment of the surface of the copper film 65b was performed before deposition and a surface oxide film was removed.

The treatment method was performed using the parallel plate type plasma enhanced CVD apparatus. $NH_3$ was introduced at the flow rate of 50 sccm to adjust the gas pressure to 1 Torr, electric power having the frequency of 13.56 MHz was applied to transform $NH_3$ into plasma, and the copper film 65b was allowed to contact the plasma while the substrate 61 was heated to 375° C.

Next, the substrate 61 is carried in the chamber 1 of the deposition apparatus, and the passivation layer (Cu barrier insulating film) 66a made of the $SiO_2$ film coating the lower wiring 65 is formed as shown in FIG. 3D. With regard to the passivation layer 66a, the deposition conditions are equivalent to the deposition conditions III in the third example of the first embodiment except for the film thickness.

After that, the insulating film (low dielectric constant insulating film) 66b made up of the $SiO_2$ film of the film thickness of about 500 nm, which is intended to be the primary insulating film of the wiring interlayer insulating film 66, and the passivation layer (Cu barrier insulating film) 66c made up of the $SiO_2$ film of the film thickness of about 50 nm are continuously formed in the same chamber 1. Thus the wiring interlayer insulating film 66 for burying the connection conductor is formed.

With regard to the primary insulating film 66b, the deposition conditions shall be equivalent to those of the lower wiring buried insulating layer 62, and the film treatment conditions shall be equivalent to those after the deposition thereof. Further, with regard to the passivation layer 66c, the conditions shall be equivalent to the deposition conditions of the passivation layer 66a.

Subsequently, the insulating film (low dielectric constant insulating film) 67 made up of the $SiO_2$ film, which is intended to be the primary insulating film of the wiring buried insulating film, and the passivation film (Cu barrier insulating film) 67b made up of the $SiO_2$ film are continuously formed in the same manner on the passivation layer 66c in the same chamber 1. Thus the wiring buried insulating film 67 that buries the upper wiring is formed. With regard to the primary insulating film 67a, the deposition conditions shall be equivalent to those of the lower wiring buried insulating layer 62, and the film treatment conditions to those after the deposition thereof. With regard to the passivation layer 67b, the deposition conditions shall be equivalent to those of the passivation layer 66a.

Next, the substrate 61 is brought out of the chamber 1 of the deposition apparatus, and the connection conductor 70 and the upper wiring 71 are formed by the well-known dual damascene method, as shown in FIG. 3E to FIG. 3G. The dual damascene method will be explained below in detail.

Specifically, after the resist film is formed on the passivation layer 67b, the opening portions of the resist film are formed by the photolithography method on regions where the via holes are to be formed, and a mask 73b is formed as shown in FIG. 3E. At this point, since the passivation film 67b does not contain nitrogen, excessive crosslinking reaction by nitrogen is suppressed, and thus the crosslinking reaction of the resist film 73b occurs only in a region defined by an exposure range. With this, the mask 73b having good dimensional precision can be formed.

Next, etching is performed to the passivation layer 67b, the insulating film 67a, the passivation layer 66c and the insulating film 66b through the openings of the resist film 73b to form an opening through them. Thus, the openings 68 are formed in the passivation layer 66c and the primary insulating film 66b of the wiring interlayer insulating film 66.

Next, another resist film is formed on the passivation layer 67b, followed by forming openings in regions where the wiring grooves are intended to be formed so that a mask 73c is formed as shown in FIG. 3F. At this point, since the passivation layer 67b, the insulating film 67a, the passivation layer 66c, the insulating film 66b, and the passivation layer 66a do not contain nitrogen, excessive crosslinking reaction by nitrogen is suppressed and thus the crosslinking reaction of the resist film 73c occurs only in a region defined by an exposure range. With this, the mask 73c having good dimensional precision can be formed.

Subsequently, the openings of the mask 73c are formed so as to have a larger opening area than that of the first openings and to include the first openings. Then, the passivation layer 67b and the insulating film 67a are etched through the openings of the mask 73c to form an opening through them. At this point, since the underlying passivation layer 66c is deposited by the deposition gas containing $CHF_3$, it has etching resistance to the etching gas of the primary insulating film 67a, and thus the passivation layer 66c stops etching. Consequently, wiring grooves 69 are formed in the wiring buried insulating film 67. After that, the passivation layer 66a is etched to form the via holes 68 through the wiring interlayer insulating film 66. As a result, the lower wiring 65 is exposed at the bottom of the via holes 68, and the lower wiring 65 and the wiring grooves 69 are connected through the via holes 68.

Next, as shown in FIG. 3G, after the TaN film and Ta film 70a are formed on the inner surface of the via holes 68 and the wiring grooves 69, the copper seed layer (not shown) is formed, followed by forming the copper film 70b thereon to fill the wiring grooves 69 therewith. Thus the connection conductor 70 and the upper wiring 71 are formed. A so-called dual damascene method has been described as above.

Next, the pre-treatment of the surface of the copper film 70b was performed before deposition in the same conditions as the pre-treatment of the surface of the copper film 65b, and thus the surface oxide film was removed. Then, the passivation layer 72 made up of the SiO₂ film is formed on the entire surface by the same deposition method as that of the passivation layer (63a or 66a). Consequently, a semiconductor device having multilayer wiring, which mainly consists of a copper film, is completed.

As described above, according to the manufacturing method of the semiconductor device of the second embodiment, the primary insulating films 62a, 66b, 67a are deposited on the deposition conditions I of the first example of the first embodiment, and the plasma treatment is performed after deposition. Therefore, the primary insulating films 62a, 66b, 67a have the low dielectric constant of 0.2.5 or less and are higher in their moisture resistance.

Furthermore, since the passivation layers 63a, 66a, 66c, 67b, 72 are formed on the deposition conditions III of the third example of the first embodiment, they have high diffusion blocking capability to Cu. Further, since the passivation layers 63a, 66a, 66c, 67b, 72 are formed by the deposition gas containing CHF₃, they contain fluorine, by which a lower dielectric constant can be achieved.

Moreover, since the insulating films (66b, 67a) and the passivation layers (66a, 66c, 67b), which are exposed to the surface, do not contain nitrogen, the mask 73c having good dimensional precision can be formed when the lower wiring grooves 64, the via holes 68 and the upper wiring grooves 69 are formed by the lithography method.

Furthermore, openings are formed through the wiring interlayer film 66 and the wiring buried insulating film 67 such that their opening areas become larger from the bottom to alternately form the via holes 68 and the wiring grooves 69 connected with the via holes 68. In other words, the passivation layer 66c becomes an underlayer of the insulating film 67a to be etched when the insulating film 67a is selectively etched.

Since the passivation layer 66c to which the present invention is applied is formed by the deposition gas containing CHF₃, it effectively functions as an etching stopper to the etchant of the primary insulating film 67a and also effectively functions as a mask against the excessive etching of the insulating film 66b under the passivation layer.

Third Embodiment

Next, the semiconductor device and the manufacturing method thereof according to the third embodiment of the present invention will be explained.

A structure similar to that of the semiconductor device of FIG. 3G can be applied to the semiconductor device according to the third embodiment.

In this case, the primary insulating films 62a, 66b, 67a correspond to the low dielectric constant insulating films of this embodiment, and the passivation layers 63a, 66a, 66c, 67b, 72 correspond to the barrier insulating films of this embodiment.

Further, a method similar to the manufacturing method of a semiconductor device of FIGS. 3A to 3G can be applied to the manufacturing method of a semiconductor device of the third embodiment.

In this case, the low dielectric constant insulating films corresponding to the primary insulating films 62, 66b, 67a are deposited on the deposition conditions (II) of the second example of the first embodiment.

Plasma treatment is performed to the primary insulating films 62, 66b, 67a after deposition by using at least one of He, Ar, H₂ and heavy hydrogen gas in the same chamber where the deposition was conducted.

Furthermore, the barrier insulating films corresponding to the passivation layers 63a, 66a, 66c, 67b, 72 are deposited on the deposition conditions (III) of the third example of the first embodiment.

According to the above-described third embodiment of the present invention, the low dielectric constant insulating film is deposited on the above deposition conditions and plasma treatment is performed after deposition, so that the low dielectric constant insulating film has the low dielectric constant of about 2.4 and its moisture resistance is high. In addition, since the barrier insulating film is formed on the deposition conditions III of the third example of the first embodiment, it can lead to high diffusion blocking capability to Cu and a lower dielectric constant.

The present invention has been explained in detail by the embodiments, but the scope of the present invention is not limited to the examples specifically shown in the above-described embodiments, and modifications of the above-described embodiments without departing from the gist of the invention are included in the scope of the present invention.

In the second embodiment, for example, although the deposition conditions of the primary insulating films 62, 66b, 67a are set to the conditions described in the first example in the first embodiment, the conditions may be properly changed for application. Further, the deposition conditions of the primary insulating films (low dielectric constant insulating film) 62, 66b, 67a may be properly changed for application as well.

Furthermore, although the deposition conditions of the passivation layers 63a, 66a, 66c, 67b, 72 are set to the deposition conditions III of the third example in the first embodiment, they may be properly changed for application.

As described above, since the present invention uses the oxidizing agent made of oxygen containing organic compound having alkoxyl group (OR: O is oxygen and R is $CH_3$ or $C_2H_5$) as an oxidizing agent, the formed film does not contain nitrogen. This can lead to improving the deposition rate, and to allowing the formed film to take in a larger amount of carbon and hydrogen to form the low dielectric constant insulating film or the barrier insulating film having a lower relative dielectric constant.

Particularly, by using the oxygen containing organic compound in which silicon combines with three or less methoxy groups or ethoxy groups as oxygen containing organic compound having alkoxyl group, a lower relative dielectric constant which is 2.5 or less in the low dielectric constant insulating film and 4 or less in the barrier insulating film can be obtained.

Further, by doping H₂O as the oxidizing agent, the film quality of the formed film can be improved.

In both cases, since a large amount of C—H and O—H, which is considered to have weak bond, is contained in the formed film, the relative dielectric constant is still as high as 2.6 to 2.7 comparing to that of the SOD film (Spin On Dielectrics). Therefore, plasma treatment is performed to the formed film after deposition to remove C—H and O—H. In the plasma treatment, a treatment gas containing at least one of noble gases, for example, He and Ar, H₂ and heavy hydrogen is generated, and electric power is applied to the treatment gas to generate plasma. The plasma of the treatment gas is allowed to contact the low dielectric constant insulating film whose temperature has been increased, and thus the relative dielectric constant of the formed film can be further reduced.

Consequently, it can lead to preventing the low dielectric constant insulating film from containing nitrogen or suppressing nitrogen content therein to an extent where nitrogen does not affect the cross-linking reaction of resist while it can lead to maintaining characteristic of the low relative dielectric constant from 2.4 to 2.5 and of superior moisture resistance.

Furthermore, when the silicon containing organic compound having a siloxane bond is used as the constituent gas of the deposition gas, the compound already contains Si—O—Si and thus Si—O bond is directly taken in the formed film. With this, excessive reaction of oxygen can be suppressed and the formed film can be stabilized.

In addition, when the silicon containing organic compound having $CH_3$ group is used as the constituent gas of the deposition gas, the formed film contains a large amount of $CH_3$ group. Accordingly, Si is terminated by $CH_3$ group and pores are formed, and thus the dielectric constant can be reduced.

Further, by performing deposition upon incorporating $C_xH_yF_z$ or $C_xH_yB_z$ (x and y are 0 (except x=y=0) or positive integer, z is positive integer) to the deposition gas of the low dielectric constant insulating film, it is possible to secure etching resistance of the low dielectric constant insulating film against the etchant of the barrier insulating film in the case of selectively etching the barrier insulating film in the laminated structure of the low dielectric constant insulating film and the barrier insulating film. Particularly, by using $C_xH_yF_z$ or $C_xH_yB_z$, it is possible to secure the etching resistance, and it is possible to allow the formed film to contain F or B and thus to achieve lower dielectric constant.

Still further, in the barrier insulating film used together with the low dielectric constant insulating film, the second deposition gas, which contains either one of silicon containing organic compound having siloxane bond and silicon containing organic compound having $CH_3$ group, and oxygen containing organic compound having alkoxyl group (OR: O is oxygen and R is $CH_3$ or $C_2H_5$) as the oxidizing agent, and to which at least one of $H_2$, $N_2O$ and $O_2$ is added, is used in the same manner as the case of the low dielectric constant insulating film. Specifically, by adding at least one of $H_2$, $N_2O$ and $O_2$ to the first deposition gas of the low dielectric constant insulating film, it is possible to form a film of better film quality, whose function to block Cu diffusion is improved although the relative dielectric constant is a little higher than that of the low dielectric constant insulating film. In addition, it is possible to prevent the barrier insulating film from containing nitrogen.

What is claimed is:

1. A deposition method, comprising the steps of:
   generating a first deposition gas consisting of (1) $H_2O$, (2) at least one silicon source selected from the group consisting of silicon containing organic compound having siloxane bond and silicon containing organic compound having $CH_3$ group and (3) an alkoxysilane as an oxidizing agent,
   wherein said silicon containing organic compound having siloxane bond is at least one compound selected from the group having a straight chain Si—O—Si bond and consisting of hexamethyldisiloxane (HMDSO:$(CH_3)_3$Si—O—Si$(CH_3)_3$) and octamethyltrisiloxane (OMTS),

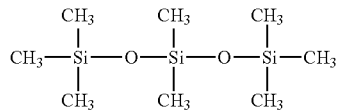

and the ground having a cyclic Si—O—Si bond and consisting of octamethylcyclotetrasiloxane (OMCTS)

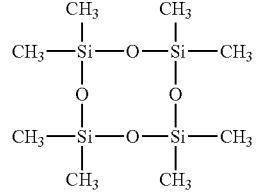

and tetramethylcyclotetrasiloxane (TMCTS)

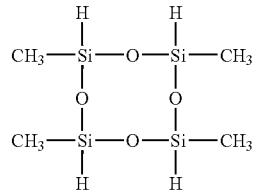

wherein the alkoxysilane consists of a member selected from the group consisting of tetramethoxysilane, trimethoxysilane, dimethoxysilane, methoxysilane, monomethyltrimethoxysilane, dimethyldimethoxysilane, trimethylmethoxysilane, tetraethoxysilane, triethoxysilane, diethoxysilane, ethoxysilane, monoethyltriethoxysilane, diethyldiethoxysilane and triethylethoxysilane; and
   applying electric power to said first deposition gas to generate plasma and then causing reaction to form a low dielectric constant insulating film on a substrate.

2. The deposition method according to claim 1, wherein at least one of He, Ar and $H_2$ is added as diluent gas to said first deposition gas.

3. The deposition method according to claim 1, wherein the silicon source is:
   two or more kinds of silicon containing organic compounds having siloxane bond, and at least one of said two or more kinds of silicon containing organic compounds having siloxane bond has straight chain Si—O—Si bond and at least one kind thereof has cyclic Si—O—Si bond.

4. The deposition method according to claim 1, wherein $C_xH_yF_z$ or $C_xH_yB_z$ (x and y are 0 (except x=y=0) or positive integer, z is positive integer) is added to said first deposition gas.

5. The deposition method according to claim 4, wherein said $C_xH_yF_z$ is any one of $C_3F_8$, $C_4F_8$ and $CHF_3$.

6. The deposition method according to claim 4, wherein said $C_xH_yB_z$ is $B_2H_6$.

7. The deposition method according to claim 1, wherein the low dielectric constant insulating film is exposed to plasma of any one of He, Ar, $H_2$ and heavy hydrogen after the step of forming said low dielectric constant insulating film.

8. A manufacturing method of a semiconductor device, comprising, at least before or after the step of forming a low dielectric constant insulating film by the deposition method according to claim 1, the steps of:

generating a second deposition gas containing at least one silicon source selected from the group of consisting of silicon containing organic compound having siloxane bond and silicon containing organic compound having $CH_3$ group, an oxidizing agent consisting of oxygen containing organic compound having alkoxyl group (OR: O is oxygen and R is $CH_3$ or $C_2H_5$), and any one of $H_2$, $N_2O$ and $O_2$; and applying electric power to said second deposition gas to generate plasma and then causing reaction to form a barrier insulating film on a substrate.

9. The manufacturing method of a semiconductor device according to claim 8, wherein said substrate includes a wiring or an electrode made mainly of copper.

10. A semiconductor device, wherein said device is formed by the manufacturing method of a semiconductor device according to claim 8.

11. The deposition method according to claim 1 wherein said silicon source is said silicon containing organic compound having siloxane bond.

* * * * *

UNITED STATES PATENT AND TRADEMARK OFFICE
CERTIFICATE OF CORRECTION

PATENT NO. : 7,238,629 B2　　　　　　　　　　　　　　　　　　　　　　　Page 1 of 1
APPLICATION NO. : 10/867178
DATED : July 3, 2007
INVENTOR(S) : Shioya et al.

It is certified that error appears in the above-identified patent and that said Letters Patent is hereby corrected as shown below:

Column 18, line 9, "ground" should read -- group --.

Signed and Sealed this

Thirtieth Day of October, 2007

JON W. DUDAS
*Director of the United States Patent and Trademark Office*